(12) United States Patent
Long

(10) Patent No.: US 10,937,980 B2
(45) Date of Patent: Mar. 2, 2021

(54) PACKAGE STRUCTURE OF DISPLAY COMPONENT AND DISPLAY DEVICE

(71) Applicant: BOE TECHNOLOGY GROUP CO., LTD., Beijing (CN)

(72) Inventor: Chunping Long, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/611,961

(22) PCT Filed: May 29, 2019

(86) PCT No.: PCT/CN2019/088944
§ 371 (c)(1),
(2) Date: Nov. 8, 2019

(87) PCT Pub. No.: WO2020/034718
PCT Pub. Date: Feb. 20, 2020

(65) Prior Publication Data
US 2020/0266376 A1 Aug. 20, 2020

(30) Foreign Application Priority Data
Aug. 16, 2018 (CN) .......................... 201821322872.X

(51) Int. Cl.
*H01L 51/52* (2006.01)
*H01L 51/50* (2006.01)

(52) U.S. Cl.
CPC .......... *H01L 51/5008* (2013.01); *H01L 51/52* (2013.01)

(58) Field of Classification Search
CPC .................... G02F 1/133308; G02F 2001/133311–133314; H01L 51/5237–5259
See application file for complete search history.

(56) References Cited

U.S. PATENT DOCUMENTS

2019/0067627 A1* 2/2019 Jia .................... H01L 51/5253
2019/0067643 A1 2/2019 Zhai et al.

FOREIGN PATENT DOCUMENTS

| CN | 107546338 A | 1/2018 |
|---|---|---|
| CN | 107565055 A | 1/2018 |
| CN | 108321304 A | 7/2018 |
| CN | 208722925 U | 4/2019 |

* cited by examiner

*Primary Examiner* — Daniel P Shook
(74) *Attorney, Agent, or Firm* — Muncy, Geissler, Olds and Lowe, P.C.

(57) ABSTRACT

The present disclosure provides a package structure of a display component and a display device. The package structure of a display component includes: a base substrate, a display component arranged on a surface of the base substrate, and an package layer covering the display component, in which the package layer includes a second inorganic layer, an organic layer, and a first inorganic layer capable of reducing amount of charges to be trapped sequentially stacked along a direction toward the display component.

20 Claims, 4 Drawing Sheets

PACKAGE STRUCTURE OF DISPLAY COMPONENT AND DISPLAY DEVICE

CROSS-REFERENCE TO RELATED APPLICATION

This application is the U.S. national phase of PCT Application No. PCT/CN2019/088944 filed on May 29, 2019, which claims a priority to Chinese Patent Application No. 201821322872.X filed on Aug. 16, 2018, the disclosures of which are incorporated in their entirety by reference herein.

TECHNICAL FIELD

The present disclosure relates to the field of packaging technology, in particular, to a package structure of a display component and a display device.

BACKGROUND

With the continuous development of display technology, the application of display components is becoming more widespread. In order to prolong the service life of display components, the packaging problem of display components has gradually attracted more attention.

SUMMARY

The present disclosure provides the following technical solutions.

In an aspect, a package structure of a display component is provided, including: a base substrate, a display component arranged on a surface of the base substrate, and an package layer covering the display component, in which the package layer includes a second inorganic layer, an organic layer, and a first inorganic layer capable of reducing an amount of charges to be trapped sequentially stacked along a direction toward the display component.

In an embodiment, the first inorganic layer is an oxynitride layer with an atomic percentage of oxygen of greater than 15%.

In an embodiment, the first inorganic layer has a thickness of less than 1 µm.

In an embodiment, the organic layer has a thickness of between 1 µm and 20 µm.

In an embodiment, the second inorganic layer has a thickness of less than 1 µm.

In an embodiment, the package layer further includes an organic buffer layer arranged between the first inorganic layer and the organic layer, the organic buffer layer having a thickness of between 0.1 µm and 0.3 µm.

In an embodiment, the package structure further includes a barrier layer covering the package layer.

In an embodiment, the first inorganic layer includes a silicon oxynitride layer.

In an embodiment, the organic layer includes an epoxy resin layer.

In an embodiment, the second inorganic layer includes at least one of a silicon nitride layer, a silica layer, a silicon oxynitride layer, and an alumina layer.

In an embodiment, the display component includes: a thin-film transistor array layer arranged on the base substrate; a light-emitting unit arranged on a surface of the thin-film transistor array layer away from the base substrate; and a protective layer covering the light-emitting unit.

In another embodiment, a display device is provided, including the package structure of the above display device.

BRIEF DESCRIPTION OF THE DRAWINGS

The drawings described herein are intended to provide a further understanding of the present disclosure, and constitute a part of this disclosure. The illustrative embodiments and the description thereof are merely intended to illustrate the present disclosure, and do not constitute an improper limitation of the present disclosure. In the drawings.

DETAILED DESCRIPTION

In order to further explain the package structure of the display component and display device according to the embodiments of the present disclosure, the present disclosure will be described in detail hereinafter in conjunction with the drawings.

In the related art, a thin-film packaging process is generally used to perform a thin-film packaging of an organic light-emitting diode (OLED) display component, and such thin-film packaging process is a process for forming a package thin film on the surface of an OLED display component. The OLED display component is packaged by the thin-film packaging process, which not only achieves a good packaging effect, but also forms a thinner package layer, thereby being advantageous for thinning of the OLED display component.

However, in the related art, when the display component is packaged by the thin-film packaging technology, the package thin film directly in contact with the display component has a high content of positive charge defect and negative charge defect, easily captures carriers in the light-emitting unit in an OLED display component, and becomes the center for trapping charge, resulting in an effect on the operating voltage and normal display of the display component.

An object of the present disclosure is to provide a package structure of a display component and a display device, which are used to solve the problem in the related package structure that the package layer easily becomes a center for trapping charge, thereby resulting in an effect on the operating voltage and normal display of the display component.

Figure 1:
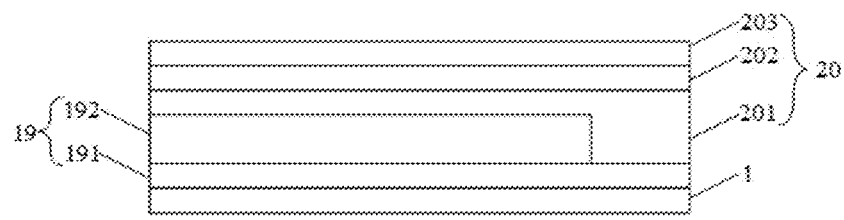
FIG. 1 is a schematic view showing a package structure of a display component according to an embodiment of the present disclosure.

As shown in FIG. 1, an embodiment of the present disclosure provides a package structure of a display component, including: a base substrate 1, a display component 19 arranged on a surface of the base substrate 1, and an package layer 20 covering the display component 19. The package layer 20 includes a second inorganic layer 203, an organic layer 202, and a first inorganic layer 201 capable of reducing the amount of charges to be trapped sequentially stacked in a direction toward the display component 19.

Specifically, the specific manufacturing process of the above package structure is shown as follows. A first inorganic layer 201 is formed on the display component 19 by a plasma enhanced chemical vapor deposition (PECVD) or atomic layer deposition (ALD), in which the first inorganic layer 201 has a relatively low ability of trapping charge, and is capable of reducing the amount of charges to be trapped in the display component. Then, the organic layer 202 is formed on the first inorganic layer 201 by a polymer monomer deposition method (Vitex), or an ink jet printing (hereinafter referred to as IJP); or a hybrid organic layer is formed by PECVD. Finally, the second inorganic layer 203 may be formed on the organic layer 202 by continuously using PECVD or ALD. It should be noted, the package layer 20 covering the display component 19, the first inorganic layer 201, the organic layer 202 and the second inorganic layer 203 formed by the above method is capable of achieving an efficient water and oxygen barrier requirements.

According to the specific structure and preparation process of the above package structure, in the package structure of the display component provided by the embodiment of the present disclosure, the package layer 20 covering the display component 19 includes a second inorganic layer 203, an organic layer 202, and a first inorganic layer 201 capable of reducing the amount of charges to be trapped sequentially stacked in a direction toward the display component 19. Since the first inorganic layer 201 is in contact with the display component 19 and the first inorganic layer 201 can reduce the amount of charges to be trapped, the package structure provided by the embodiment can better reduce the amount of charges to be trapped in the display component by the package layer, thereby better ensuring the operating voltage and normal display of the display component.

In the above embodiment, the first inorganic layer 201 may be, for example, an oxynitride layer with an atomic percentage of oxygen of greater than 15%.

In the related art, since silicon nitride has a strong effect on preventing diffusion of impurity elements, such as oxygen, sodium, and boron, and of water, the inorganic layer in contact with the display component 19 is mostly made of silicon nitride when the display component 19 is packaged. However, due to the existence of silicon dangling bonds in silicon nitride and the characteristic that the silicon dangling bond increases as the nitrogen content increases, the prepared silicon nitride thin film exhibits a very high dielectric constant and tensile stress under certain conditions, and the nitrogen-rich (SiNx) thin films have a high content of positive and negative charge defects, which become centers for trapping charge and are not conducive to direct contact with display component 19.

In the above embodiment, the first inorganic layer 201 is set to be an oxynitride layer with an atomic percentage of oxygen of greater than 15%, so that the oxygen element in the first inorganic layer 201 has a relatively high content, thereby effectively reducing the content of other elements in the first inorganic layer 201. Typically, when the first inorganic layer is made of silicon oxynitride, the atomic percentage of the oxygen element is set to be greater than 15%, so that the content of the silicon element and the nitrogen element in the first inorganic layer can be lowered, thereby overcoming the above defects caused by a large content of nitrogen elements and the silicon element and better ensuring the operating voltage and normal display of the display component 19.

Further, in the above embodiment, the thicknesses of the first inorganic layer 201, the organic layer 202, and the second inorganic layer 203 may be set according to actual needs. Illustratively, the thickness of the first inorganic layer 201 may be, for example, less than 1 μm. Further, illustratively, the thickness of the organic layer 202 may be, for example, between 1 μm and 20 μm. Further, illustratively, the thickness of the second inorganic layer 203 may be, for example, less than 1 μm.

In the above embodiment, the provision of the first inorganic layer 201, the organic layer 202, and the second inorganic layer 203 having the above thickness not only ensures efficient water and oxygen barrier effects, but also limits the overall thickness of the package layer 20 to a relatively thin range, i.e., being more advantageous for the thinning of the package structure of the display component 19 while ensuring the packaging effect.

Figure 2:
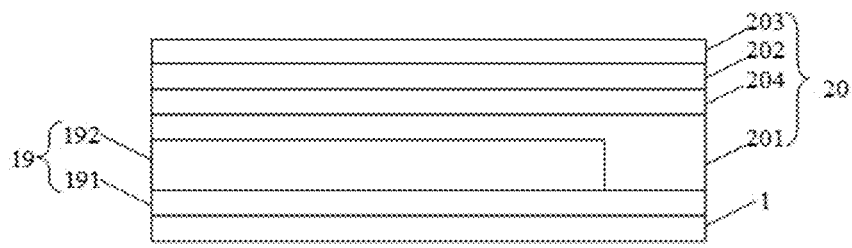
FIG. 2 is a schematic view showing a package structure of a display component according to another embodiment of the present disclosure.

Further, as shown in FIG. 2, in the above embodiment, the package layer 20 may further include an organic buffer layer 204 arranged between the first inorganic layer 201 and the organic layer 202. Typically, the thickness of the organic buffer layer 204 is between 0.1 μm and 0.3 μm.

As for the organic buffer layer 204, it can be formed by PECVD. The thickness of the organic buffer layer 204 can be formed to be, for example, between 0.1 μm and 0.3 μm. Since the thickness of the organic buffer layer 204 is relatively thin, the deposition time is shorter. Moreover, it is more advantageous for reducing the difference in interface between the organic layer and the inorganic layer, compared with the relatively thick organic layer 202. Moreover, since the organic buffer layer 204 can be deposited by PECVD in combination with a mask having a specific opening, the preparation of the relatively thin organic buffer layer 204 is more advantageous for subsequent mask cleaning operations.

It should be noted, when the organic buffer layer 204 is prepared, the organic buffer layer 204 and the first inorganic layer 201 can be completed in the same process chamber, that is, the same process flow can be used. In this way, the time for substrate transfer and alignment can be reduced, the process of preparing the first inorganic layer 201 and the organic buffer layer 204 is continuous, and the defects of the intermediate interface between the first inorganic layer 201 and the organic layer 202 can be reduced, thereby resulting in both an inorganic layer 201 and an organic buffer layer 204 with a higher quality.

Further, the material for preparing the organic buffer layer 204 described above can be various. Illustratively, the organic buffer layer 204 can be prepared by plasma polymerization of PP (polypropylene)-hexamethyldisiloxane (HMDSO). When the organic buffer layer 204 is cured, the organic buffer layer 204 may be cured by introducing a plasma (for example, oxygen-containing plasma, fluorine-containing plasma, etc.) into the process chamber, to achieve an accurate and timely control of the surface characteristics of the organic buffer layer 204.

It should be noted, the curing process of the organic buffer layer 204 may be performed in a PECVD chamber, or in a pre-processing chamber of the IJP process for preparing the organic layer 202. Given that the process time interval of the organic layer 202 and the organic buffer layer 204 and the contact angle characteristics may vary with time, etc., they may be appropriately selected according to the condition of the production line equipment. If the above process time interval is short, the curing of the organic buffer layer 204 can be placed in the PECVD chamber. If the above process time interval is long, the curing of the organic buffer layer 204 can be placed in the IJP process pre-treatment chamber, thereby ensuring good contact angle characteristics.

Further, in order to better control the phenomenon that the ink edges of the organic buffer layer 204 to be formed are not aligned, flow, or the like, plasma curing at different concentrations may be performed in section when the organic buffer layer 204 is cured. For example, the concentration of the plasma introduced in the edge region of the organic buffer layer 204 may be lower than the concentration of the plasma introduced in the central region; or, the plasma may be partitioned into the different regions when the organic buffer layer 204 is cured. For example, an oxygen-containing plasma is introduced into the central region of the organic buffer layer 204, and a fluorine-containing plasma is introduced into the edge region.

Figure 3:
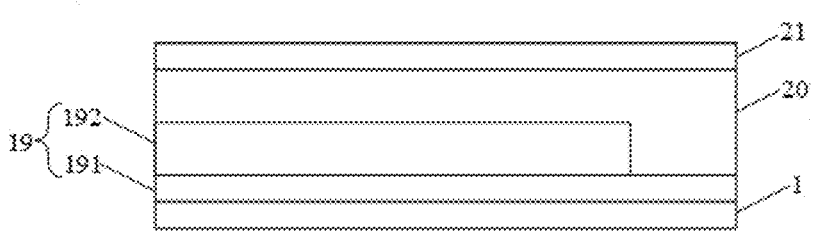
FIG. 3 is a schematic view showing a package structure of a display component according to still another embodiment of the present disclosure.

Further, in order to better ensure the packaging effect on the display component 19, as shown in FIG. 3, in the above embodiment, the package structure of the display component 19 may further include a barrier layer 21 covering the package layer 20.

Specifically, in order to further improve the packaging effect of the display component 19, after the package layer 20 is formed, and the barrier layer 21 may be further formed on the package layer 20, such that the barrier layer 21 covers the package layer 20, thereby better shielding the display component 19 from the outside environment, to achieves a better packaging effect on the entire display component 19. The barrier layer 21 can be made of a flexible material, such as polyethylene terephthalate (PET) or polyethylene naphthalate (PEN).

Further, the first inorganic layer 201, the organic layer 202, and the second inorganic layer 203 described above may be made of a variety of materials. The materials used in each layer are briefly described below.

The first inorganic layer 201 may include a silicon oxynitride layer. Typically, the first inorganic layer 201 can be made of silicon oxynitride.

The organic layer 202 may include an epoxy resin layer. Typically, the organic layer 202 can be made of an organic material based on epoxy resin. When the organic layer 202 is made of an organic material based on epoxy resin, the curing of the organic layer 202 is preferably carried out by heating and irradiating visible light. It should be noted, when the package layer 20 is formed, the organic buffer layer 204 may not be formed, that is, after the preparation of the first inorganic layer 201 is completed, the organic material based on epoxy resin is directly used, and the organic layer 202 is formed on the first inorganic layer 201 by the inkjet printing process.

The second inorganic layer 203 may include at least one of: a silicon nitride layer, a silica layer, a silicon oxynitride layer, and an aluminum oxide layer. Typically, the second inorganic layer 203 may be made of silicon nitride, silica, silicon oxynitride, and/or aluminum oxide, and a specific preparation process may be formed by PECVD deposition.

It should be noted, when both the first inorganic layer 201 and the second inorganic layer 203 are made of silicon oxynitride, since the first inorganic layer 201 is in contact with the display component 19, the atomic percentage of the oxygen element therein is set, for example, to be greater than 15%; and since the second inorganic layer 203 is far from the display component 19, the content of the oxygen element therein may not be specifically required. Illustratively, in the first inorganic layer 201, the atomic percentage of the oxygen element is 18%, the atomic percentage of the nitrogen element is 32%, and the atomic percentage of the silicon element is 50%; and in the second inorganic layer 203, the atomic percentage of the oxygen element is 5%, the atomic percentage of nitrogen is 40%, and the atomic percentage of silicon is 55%.

Illustratively, the thickness and material of the first inorganic layer 201 (TFE1), the organic layer 202 (TFE2), and the second inorganic layer 203 (TFE3) are shown in Table 1.

TABLE 1

| TFE1 | Thickness of thin film (μm) | 0.899 | 0.78 | 0.8 |
|---|---|---|---|---|
|  | Material | SiON | SiON | SiON |
| TFE2 | Thickness of thin film (μm) | 7.7 | 8.396 | 3.5 |
|  | Material | IJP ink | IJP ink | polymer |
| TFE3 | Thickness of thin film (μm) | 0.583 | 0.57 | 0.6 |
|  | Material | SiNx | SiNx | SiNx |

Further, as shown in FIG. 1, in the foregoing embodiment, the display component 19 may specifically include: a thin-film transistor array layer 191 arranged on the base substrate 1; a light-emitting unit 192 arranged on a surface of the thin-film transistor array layer 191 away from the base substrate 1; and a protective layer (not shown) covering the light-emitting unit 192.

Specifically, the base substrate 1 may be selected from a glass substrate or a flexible substrate. The thin-film transistor array layer 191 arranged on the base substrate 1 includes a thin-film transistor array and various control circuits. The light-emitting unit 192 may include an anode, an R, G, B light-emitting layer distributed in an array, and a cathode. The light-emitting unit 192 can be prepared by a way of evaporation. The above protective layer can also be produced by vapor deposition, preferably by an organic substance capable of absorbing ultraviolet light. The protective layer is mainly used to weaken the plasma damage generated by the light-emitting unit and the effect of the ultraviolet light on the light-emitting unit in the process of preparing the package layer.

After the thin-film transistor array layer 191 is formed on the base substrate 1, an array substrate is formed. The array substrate may be specifically a low-temperature polysilicon thin-film field effect transistor array substrate. In the preparation process of the low-temperature polysilicon film field effect transistor array substrate, 8 to 9 mask processes are generally required. With reference to FIGS. 4A to 4H, the preparation process of the low-temperature polysilicon film field effect transistor array substrate will be described below. It should be noted, the low-temperature polysilicon thin-film field effect transistor included in the low-temperature polysilicon thin-film field effect transistor array substrate is generally formed in a display area, and the display area generally further includes a plurality of data lines and a plurality of gate lines distributed in an array.

Figure 4A:
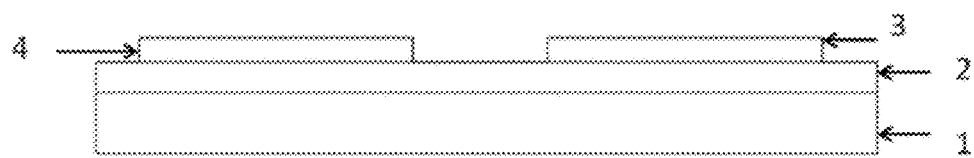
FIGS. 4A-4H are flow charts of preparing an array substrate according to an embodiment of the present disclosure.

As shown in FIG. 4A, a silicon nitride film and a silicon oxide film are sequentially deposited on the entire base substrate 1 by PECVD, to form a buffer layer 2 composed of silicon nitride and silicon dioxide. Next, an amorphous silicon thin film is formed on the buffer layer 2 by PECVD or other chemical or physical vapor deposition method, and the amorphous silicon is crystallized into a polysilicon thin film by laser annealing (ELA) or solid phase crystallization (SPC). Then, a pattern of a photoresist layer is formed on the polysilicon film by a conventional mask process, and the polysilicon film not protected by the photoresist layer as an etch barrier layer is etched by plasma, to form a polysilicon active layer 4 and a polysilicon storage capacitor 3. The transistor channel in the polysilicon active layer 4 is doped with a low concentration ion by an ion implantation process, and a conductive channel required for the thin-film transistor is formed in the polysilicon active layer 4.

Figure 4B:
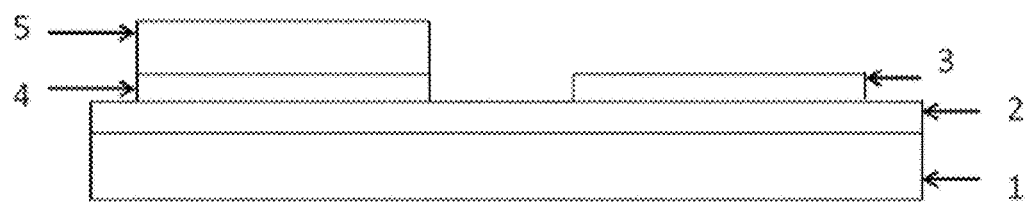

As shown in FIG. 4B, a photoresist 5 composed of a photoresist material is formed on the polysilicon active layer 4 by a mask process, to protect the polysilicon active layer 4 from ion implantation. A high-concentration ion implantation process is performed on the polysilicon storage capacitor 3 not protected by the photoresist layer, to convert the polysilicon storage capacitor 3 into a low-resistance doped polysilicon film. In the subsequent process shown in FIG. 4C to FIG. 4G, since the second plate of the capacitor composed of the gate insulating layer and the gate metal thin film is formed only on the polysilicon storage capacitor 3, the only subsequent lithography process of the polysilicon storage capacitor 3, i.e., the photolithography process of forming the second plate of the capacitor, is no longer shown in FIGS. 4C to 4G.

Figure 4C:
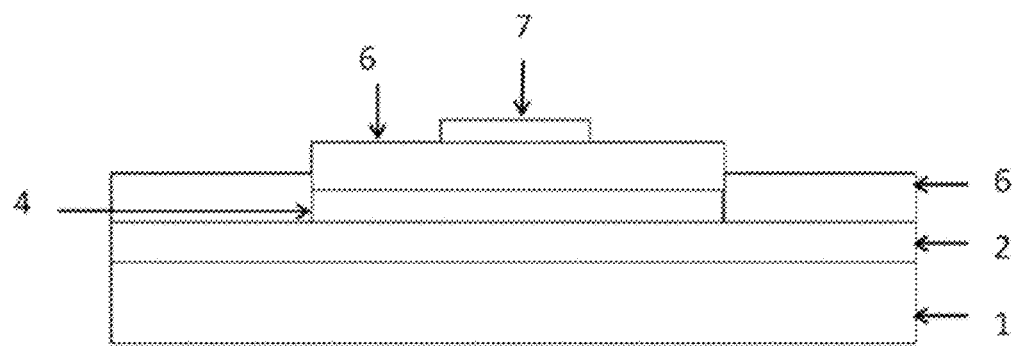

As shown in FIG. 4C, the photoresist 5 on the polysilicon active layer 4 is removed by a photoresist stripping process, a silicon dioxide film or a composite film of silicon dioxide and silicon nitride is formed by PECVD, and a gate insulating layer 6 is formed on the polysilicon storage capacitor 3, the polysilicon active layer 4 and the entire buffer layer 2. One or more low-resistance metal thin films are deposited on the gate insulating layer 6 by a physical vapor deposition method, such as magnetron sputtering, and the gate electrode 7 is formed by a photolithography process. The gate metal thin film may be a single-layer metal thin film, such as Al, Cu, Mo, Ti, or aluminum-niobium alloy (AlNd); or may be a multilayer metal thin film, such as Mo/Al/Mo or Ti/Al/Ti. The polysilicon active layer 4 is ion doped using the gate electrode 7 as an ion implantation blocking layer, and a low impedance source and drain electrode contact area is formed in the polysilicon active layer 4 area not blocked by the gate electrode 7.

Figure 4D:
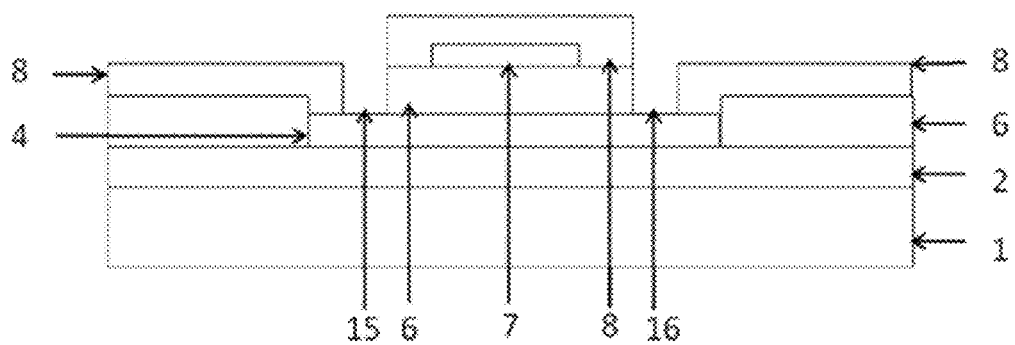

As shown in FIG. 4D, an interlayer insulating layer 8 is formed by sequentially depositing a silicon oxide film and a silicon nitride film via PECVD on the entire surface including the gate electrode 7. The source electrode contact hole 15 and the drain electrode contact hole 16 are formed by etching the interlayer insulating layer 8 via a mask process and an etching process.

Figure 4E:
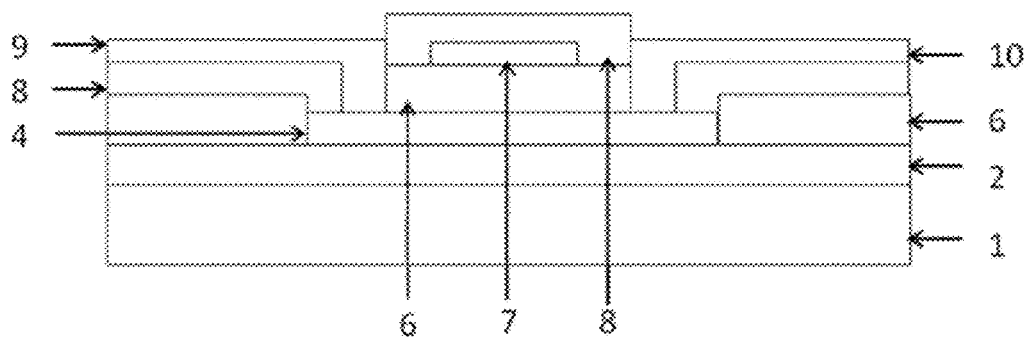

As shown in FIG. 4E, one or more low-resistance metal thin films are deposited on the interlayer insulating layer 8, the source electrode contact holes 15 and the drain electrode contact holes 16 by magnetron sputtering, and the source electrode 9 and the drain electrode 10 are formed via a mask process and an etching process. The source electrode 9 and the drain electrode 10 form an ohmic contact with the polysilicon active layer 4 through the source electrode contact hole 15 and the drain electrode contact hole 16, respectively. The ions doped in the polysilicon active layer 4 are activated by using rapid thermal annealing or heat treatment furnace annealing, to form an effective conductive channel in the polysilicon active layer 4 under the gate electrode 7. It should be noted, the above-mentioned metal thin film for forming the source electrode 9 and the drain electrode 10 may be a single-layer metal thin film, such as Al, Cu, Mo, Ti or AlNd; or may be a multi-layer metal thin film, such as Mo/Al/Mo or Ti/Al/Ti.

Figure 4F:
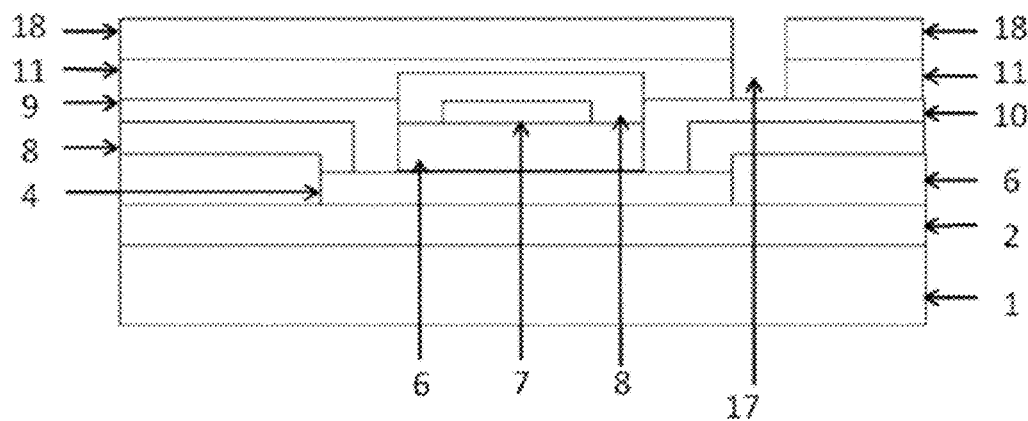

As shown in FIG. 4F, a silicon nitride film is deposited on the entire surface including the source electrode 9 and the drain electrode 10 by PECVD, and a passivation layer 11 including a via hole 17 is formed by a mask process and an etching process. A hydrogenation process is performed by using rapid thermal annealing or heat treatment furnace annealing, to repair defects in the inside and interface of the polysilicon active layer 4. Once again, through the mask process, an organic planarization layer 18 having the same via hole as the via holes 17 is formed on the passivation layer 11, to fill the surface of the component and to form a flat surface.

Figure 4G:
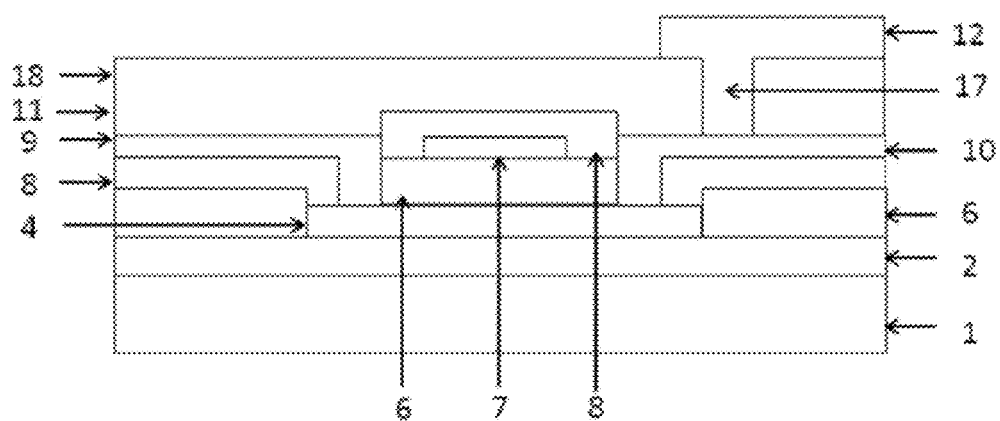
Figure 4H:
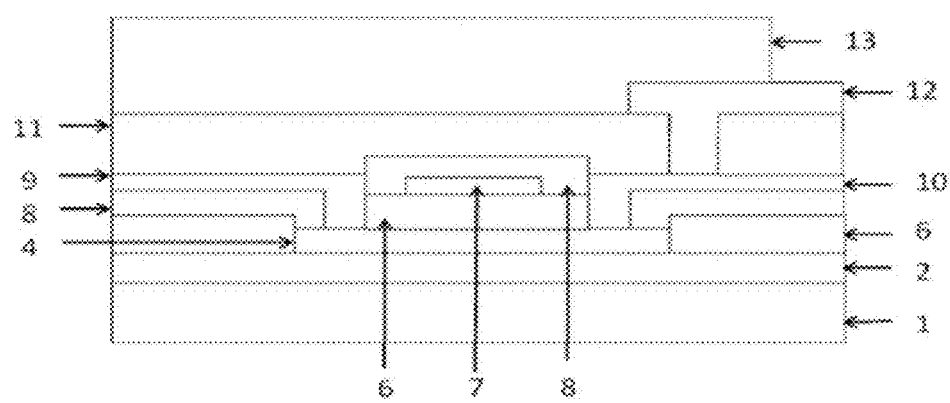

As shown in FIG. 4G, a transparent conductive thin film is deposited on the organic planarization layer 18 and the via hole 17 by magnetron sputtering, the transparent conductive thin film is etched by a photolithography process, and a pixel electrode 12 of a pixel region is formed on the via hole 17 and a portion of the organic planarization layer 18. Then, a photosensitive organic material similar to the organic planarization layer 18 is coated on the organic planarization layer 18 and the pixel electrode 12, and a partial area of the pixel electrode 12 is exposed through a final mask process, to form the pixel definition layer 13 as shown in FIG. 4H. The pixel definition layer 13 covers the organic planarization layer 18 and a portion of the pixel electrode 12 region. It should be noted, the transparent conductive thin film for forming the pixel electrode 12 may be a single-layer oxide conductive thin film, such as indium tin oxide (ITO) or indium zinc oxide (IZO), or may be a composite film, such as ITO/Ag/ITO or IZO/Ag.

According to the preparation process of FIG. 4A to FIG. 4H described above, at least 8 to 9 photolithography processes are required to form the low-temperature polysilicon thin-film field effect transistor array substrate as shown in FIG. 4H.

Another embodiment of the present disclosure further provides a display device including the package structure of the display component provided by the above embodiments.

Since the package structure of the display component provided by the above embodiment can better reduce the effect of the trapped charge on the display component and better ensure the operating voltage and the normal display of the display component, the display device provided in this embodiment also includes the above-described effects when the package structure of the above display component is included.

Unless otherwise defined, technical terms or scientific terms used herein have the normal meaning commonly understood by one skilled in the art in the field of the present disclosure. The words "first", "second", and the like used in the present disclosure does not denote any order, quantity, or importance, but rather merely serves to distinguish different components. The "including", "comprising", and the like used in the present disclosure means that the element or item appeared in front of the word encompasses the element or item and their equivalents listed after the word, and does exclude other elements or items. The word "connected" or "connecting" and the like are not limited to physical or mechanical connections, but may include electrical connections, whether direct or indirect. "On", "under", "left", "right" and the like are only used to represent relative positional relationships, and when the absolute position of the described object is changed, the relative positional relationship may also be changed, accordingly.

It will be understood that when an element, such as a layer, film, region, or substrate, is referred to as being "on" or "under" another element, the element may be directly "on" or "under" another element, or there may be an intermediate element.

In the description of the above specific embodiments, the specific features, structures, materials or features may be combined in any suitable manner in any one or more embodiments or examples.

The above description is merely the specific embodiment of the present disclosure, but the scope of the present disclosure is not limited thereto. Moreover, any person skilled in the art would readily conceive of modifications or substitutions within the technical scope of the present disclosure, and these modifications or substitutions shall also fall within the protection scope of the present disclosure. Therefore, the protection scope of the present disclosure should be determined by the scope of the claims.

What is claimed is:

1. A package structure of a display component, comprising: a base substrate, a display component arranged on a surface of the base substrate, and an package layer covering the display component, wherein the package layer comprises a second inorganic layer, an organic layer, and a first inorganic layer capable of reducing an amount of charges to be trapped sequentially stacked along a direction toward the display component.

2. The package structure of the display component of claim 1, wherein the first inorganic layer is an oxynitride layer with an atomic percentage of oxygen of greater than 15%.

3. The package structure of the display component of claim 1, wherein the first inorganic layer has a thickness of less than 1 μm.

4. The package structure of the display component of claim 1, wherein the organic layer has a thickness of between 1 μm and 20 μm.

5. The package structure of the display component of claim 1, wherein the second inorganic layer has a thickness of less than 1 μm.

6. The package structure of the display component of claim 1, wherein the package layer further comprises an organic buffer layer arranged between the first inorganic layer and the organic layer.

7. The package structure of the display component of claim 6, wherein the organic buffer layer has a thickness of between 0.1 μm and 0.3 μm.

8. The package structure of the display component of claim 1, wherein the package structure further comprises a barrier layer covering the package layer.

9. The package structure of the display component of claim 1, wherein the first inorganic layer comprises a silicon oxynitride layer.

10. The package structure of the display component of claim 1, wherein the organic layer comprises an epoxy resin layer.

11. The package structure of the display component of claim 1, wherein the second inorganic layer comprises at least one of a silicon nitride layer, a silica layer, a silicon oxynitride layer, and an alumina layer.

12. The package structure of the display component of claim 1, wherein the display component comprises:
  a thin-film transistor array layer arranged on the base substrate;
  a light-emitting unit arranged on a surface of the thin-film transistor array layer away from the base substrate; and
  a protective layer covering the light-emitting unit.

13. A display device, comprising the package structure of the display component of claim 1.

14. The display device of claim 13, wherein the first inorganic layer is an oxynitride layer with an atomic percentage of oxygen of greater than 15%.

15. The display device of claim 13, wherein the first inorganic layer comprises a silicon oxynitride layer, and the first inorganic layer has a thickness of less than 1 μm.

16. The display device of claim 13, wherein the organic layer comprises an epoxy resin layer, and the organic layer has a thickness of between 1 μm and 20 μm.

17. The display device of claim 13, wherein the second inorganic layer comprises at least one of a silicon nitride layer, a silica layer, a silicon oxynitride layer, and an alumina layer, and the second inorganic layer has a thickness of less than 1 μm.

18. The display device of claim 13, wherein the package layer further comprises an organic buffer layer arranged between the first inorganic layer and the organic layer, and the organic buffer layer has a thickness of between 0.1 μm and 0.3 μm.

19. The display device of claim 13, wherein the package structure further comprises a barrier layer covering the package layer.

20. The display device of claim 13, wherein the display component comprises:
  a thin-film transistor array layer arranged on the base substrate;
  a light-emitting unit arranged on a surface of the thin-film transistor array layer away from the base substrate; and
  a protective layer covering the light-emitting unit.

* * * * *